(12) United States Patent
Zhang et al.

(10) Patent No.: US 10,297,695 B2
(45) Date of Patent: May 21, 2019

(54) THIN FILM TRANSISTOR AND METHOD FOR DETECTING PRESSURE BY UTILIZING THE SAME AND TOUCH APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Bin Zhang, Beijing (CN); Guangxing Wang, Beijing (CN); Pengming Chen, Beijing (CN); Yu Xie, Beijing (CN); Kan Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/566,526

(22) PCT Filed: Apr. 28, 2017

(86) PCT No.: PCT/CN2017/082326
§ 371 (c)(1),
(2) Date: Oct. 13, 2017

(87) PCT Pub. No.: WO2018/036190
PCT Pub. Date: Mar. 1, 2018

(65) Prior Publication Data
US 2018/0286989 A1 Oct. 4, 2018

(30) Foreign Application Priority Data

Aug. 26, 2016 (CN) .......................... 2016 1 0742811

(51) Int. Cl.
G09G 5/00 (2006.01)
H01L 29/84 (2006.01)
(Continued)

(52) U.S. Cl.
CPC .............. *H01L 29/84* (2013.01); *G06F 3/041* (2013.01); *G06F 3/0414* (2013.01);
(Continued)

(58) Field of Classification Search
CPC ....... G06F 3/016; G06F 3/0414; H01L 27/20; H01L 1/16; H01L 29/24; H01L 27/0414; H01L 29/84; H01L 41/094
(Continued)

(56) References Cited

U.S. PATENT DOCUMENTS

2009/0115741 A1    5/2009   Wang et al.
2009/0127977 A1*   5/2009   So ........................... H01L 27/20
                                                                310/322
(Continued)

FOREIGN PATENT DOCUMENTS

CN    101377596 A    3/2009
CN    101430621 A    5/2009
(Continued)

OTHER PUBLICATIONS

The First Chinese Office Action dated May 12, 2017; Appln. No. 201610742811.8.
(Continued)

Primary Examiner — Jennifer T Nguyen
(74) Attorney, Agent, or Firm — Ladas & Parry LLP

(57) ABSTRACT

A thin film transistor and a method for detecting a pressure by utilizing the thin film transistor, and a touch apparatus are provided. The thin film transistor includes an active layer; a source electrode and a drain electrode, separated from each other and both connected with the active layer; a first
(Continued)

insulation layer, staked with the active layer; and a piezo-electric layer, separated from the active layer by the first insulation layer and separated from the source electrode and the drain electrode.

16 Claims, 3 Drawing Sheets

(51) Int. Cl.
    *G06F 3/041*     (2006.01)
    *H01L 29/423*     (2006.01)
    *H01L 29/786*     (2006.01)
    *H01L 27/12*     (2006.01)
    *H01L 41/193*     (2006.01)

(52) U.S. Cl.
    CPC .......... *H01L 27/124* (2013.01); *H01L 29/423* (2013.01); *H01L 29/786* (2013.01); *G06F 2203/04102* (2013.01); *H01L 29/7869* (2013.01); *H01L 29/78663* (2013.01); *H01L 29/78672* (2013.01); *H01L 41/193* (2013.01)

(58) Field of Classification Search
    USPC ............................................ 345/173; 257/43
    See application file for complete search history.

(56) References Cited

U.S. PATENT DOCUMENTS

| | | |
|---|---|---|
| 2014/0176494 A1 | 6/2014 | Huang |
| 2014/0191221 A1* | 7/2014 | Benwadih ............... G01L 9/008 257/40 |
| 2015/0336132 A1 | 11/2015 | Amano |

FOREIGN PATENT DOCUMENTS

| | | |
|---|---|---|
| CN | 101739161 B | 8/2011 |
| CN | 103885223 A | 6/2014 |
| CN | 104123021 A | 10/2014 |
| CN | 105808001 A | 7/2016 |
| CN | 106328716 A | 1/2017 |

OTHER PUBLICATIONS

The Second Chinese Office Action dated Sep. 19, 2017; Appln. No. 201610742811.8.
The International Search Report and Written Opinion dated Aug. 9, 2017; PCT/CN2017/082326.

* cited by examiner

THIN FILM TRANSISTOR AND METHOD FOR DETECTING PRESSURE BY UTILIZING THE SAME AND TOUCH APPARATUS

TECHNICAL FIELD

Embodiments of the present disclosure relate to a thin film transistor and a method for detecting a pressure by utilizing the thin film transistor, and a touch apparatus.

BACKGROUND

Currently, touch technology has been widely applied to electronic devices, such as a mobile phone, a tablet personal computer and the like. The touch technology provides an efficient and convenient human-computer interaction mode, and the basic principle of the touch technology is that touch action and action information of a touch object (e.g., a human finger or a stylus) is captured, the captured touch action and action information are converted into an electric signal and the electric signal is judged and identified so as to achieve a control function.

SUMMARY

According to embodiments of the disclosure, a thin film transistor is provided. The thin film transistor comprises: an active layer; a source electrode and a drain electrode, separated from each other and both connected with the active layer; a first insulation layer, staked with the active layer; and a piezoelectric layer, separated from the active layer by the first insulation layer and separated from the source electrode and the drain electrode.

For example, the thin film transistor further comprises a gate electrode and a second insulation layer, the second insulation layer separates the gate electrode from the active layer, and in a direction perpendicular to the active layer, the second insulation layer and the first insulation layer are respectively arranged on opposite sides of the active layer.

For example, in a direction perpendicular to the active layer, the first insulation layer is arranged between a layer in which the source electrode and the drain electrode are provided and the piezoelectric layer.

For example, in a direction from the source electrode to the drain electrode, a size of the piezoelectric layer is greater than or equal to a distance between the source electrode and the drain electrode.

For example, in a case that the piezoelectric layer is applied with a pressure, the piezoelectric layer is configured as a gate electrode of the thin film transistor.

For example, the thin film transistor further comprises a base substrate for bearing the active layer, the source electrode, the drain electrode, the first insulation layer and the piezoelectric layer, the piezoelectric layer is arranged on a side of the active layer, which is far away from the base substrate.

For example, the piezoelectric layer is positioned on a side of a layer in which the source electrode and the drain electrode are provided, which is far away from the active layer.

For example, a material of the piezoelectric layer includes a flexible piezoelectric material.

For example, a material of the piezoelectric layer includes a high molecular piezoelectric material.

According to the embodiments of the disclosure, a method for detecting a pressure by utilizing the thin film transistor as described above is provided. The method comprises: detecting a value of a current between the source electrode and the drain electrode of the thin film transistor; and according to the value of the current, determining whether the piezoelectric layer of the thin film transistor is applied with the pressure and/or determining an amount of the pressure applied to the piezoelectric layer.

According to the embodiments of the disclosure, a touch apparatus comprising a plurality of thin film transistors as described above is provided, and the piezoelectric layers of the plurality of thin film transistors are separated from each other.

For example, the touch apparatus further comprises: a plurality of first signal lines, respectively connected with the source electrodes of the plurality of thin film transistors; and a plurality of second signal lines, respectively connected with the drain electrodes of the plurality of thin film transistors, and an extension direction of the second signal lines and an extension direction of the first signal lines intersect with each other.

For example, each of the thin film transistor further includes a second insulation layer and a gate electrode, the gate electrode is separated from the active layer by the second insulation layer; the touch apparatus further comprises: a plurality of first signal lines, respectively connected with the source electrodes of the plurality of thin film transistors; a plurality of second signal lines, respectively connected with the drain electrodes of the plurality of thin film transistors; and a plurality of third signal lines, respectively connected with the gate electrodes of the plurality of thin film transistors, wherein an extension direction of the third signal lines intersects with an extension direction of the first signal lines or the second signal lines.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

A thin film transistor and a method for detecting a pressure by utilizing the thin film transistor and a touch apparatus, which are provided by embodiments of the present disclosure, will be illustrated in detail below in connection of the drawings.

Figure 1:
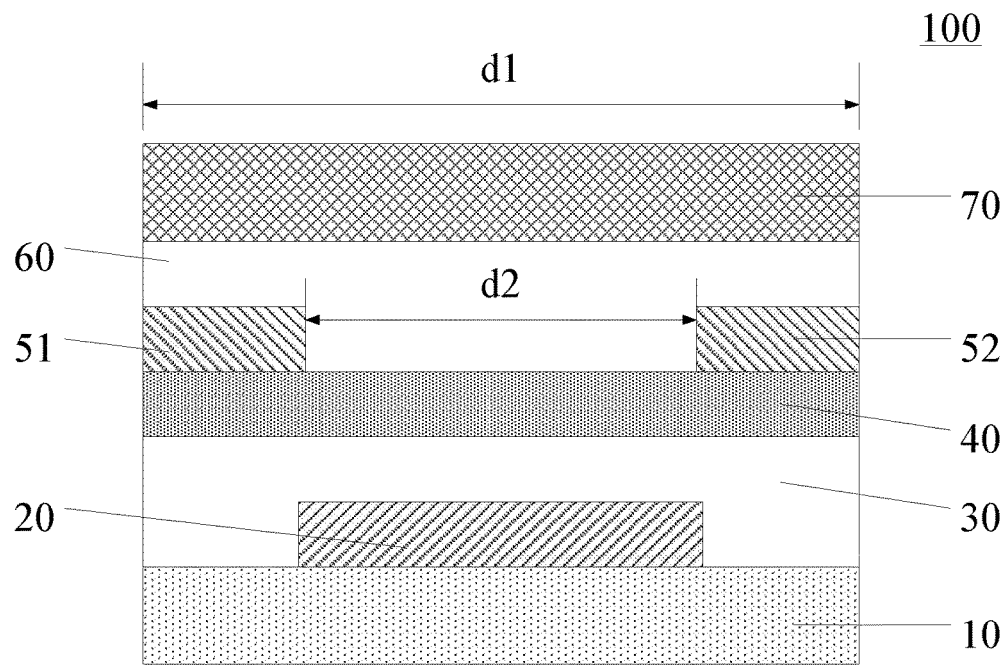
FIG. 1 is a sectional schematic view illustrating a thin film transistor provided by embodiments of the present disclosure.

As shown in FIG. 1, at least one embodiment of the present disclosure provides a thin film transistor 100, the thin film transistor 100 includes: an active layer 40; a source electrode 51 and a drain electrode 52, which are separated from each other and both connected with the active layer 40; a first insulation layer 60, which is staked with the active layer 40; and a piezoelectric layer 70, which is separated from the source electrode 51 and the drain electrode 52 (for example, the piezoelectric layer 70 is separated from the source electrode 51 and the drain electrode by the first insulation layer 60), includes a portion positioned between the source electrode 51 and the drain electrode 52 in a direction in parallel to the active layer 40, and is separated from the active layer 40 by the first insulation layer 60.

For example, the source electrode 51 and the drain electrode 52 are arranged above or below the active layer 40; and for example, the piezoelectric layer 70 is also arranged above or below the active layer 40. For example, the source electrode 51 and the drain electrode 52 are provided on a side of the active layer 40, which is opposite to a side of the active layer 40 provided with the piezoelectric layer 70. For example, the source electrode 51 and the drain electrode 52 are provided on the side of the active layer 40, which is same as the side of the active layer 40 provided with the piezoelectric layer 70.

According to the embodiments of the present disclosure, a piezoelectric induction detection mode is adopted, and the piezoelectric layer 70 is arranged in the thin film transistor 100; the piezoelectric layer 70 for example is used as a gate electrode of the thin film transistor 100, and in a case that the piezoelectric layer 70 is applied with a pressure, positive and negative charges are generated on both sides of the piezoelectric layer 70 (i.e., a gate voltage is generated) due to a piezoelectric effect, and a quantity of the generated charges is in direct proportion to the applied pressure, so that a current between the source electrode 51 and the drain electrode 52 of the thin film transistor 100 is changed. In this way, pressure detection is implemented according to the current between the source electrode 51 and the drain electrode 52 so as to determine whether the piezoelectric layer 70 is applied with the pressure and/or determine an amount of the applied pressure.

For example, the thin film transistor 100 provided by at least one embodiment of the present disclosure further includes a second insulation layer 30 and a gate electrode 20, the gate electrode 20 is separated from the active layer 40 by the second insulation layer 30, and in a direction (i.e., in a vertical direction in FIG. 1) perpendicular to the active layer 40, the second insulation layer 30 and the first insulation layer 60 are respectively arranged on opposite sides of the active layer 40. In other words, in the direction perpendicular to the active layer 40, the piezoelectric layer 70 and the gate electrode 20 are respectively arranged on opposite sides of the active layer 40. In such case, the thin film transistor 100 is a dual-gate thin film transistor with the piezoelectric characteristic.

For example, in the direction perpendicular to the active layer 40, the first insulation layer 60 is arranged between a layer in which the source electrode 51 and the drain electrode 52 are provided and the piezoelectric layer 70.

For example, in a direction from the source electrode 51 to the drain electrode 52, a size d1 of the piezoelectric layer 70 is greater than or equal to a distance d2 between the source electrode 51 and the drain electrode 52, which is beneficial for the piezoelectric layer 70 to cover an entirety of a channel region of the active layer 40, so that the source electrode 51 is electrically connected with the drain electrode 52 to generate a channel current in a case that the piezoelectric layer 70 is applied with the pressure.

For example, with further reference to FIG. 1, the thin film transistor 100 provided by at least one embodiment of the present disclosure further includes a base substrate 10 for bearing the active layer 40, the source electrode 51, the drain electrode 52, the first insulation layer 60 and the piezoelectric layer 70, and the piezoelectric layer 70 is arranged on a side of the active layer 40, which is far away from the base substrate 10. The piezoelectric layer 70 is arranged on an upper side of the active layer 40 in FIG. 1; and in the case that the thin film transistor 100 is touched by a user, the piezoelectric layer 70 is relatively close to a finger of the user, and thus, the piezoelectric layer 70 is easy to be applied with the pressure so as to benefit for improving the pressure detection performance of the thin film transistor 100.

For example, in the case that the piezoelectric layer 70 is arranged on the side of the active layer 40, which is far away from the base substrate 10, the piezoelectric layer 70 is positioned on a side of the layer in which the source electrode 51 and the drain electrode 52 are provided, which is far away from the active layer 40. Based on that the piezoelectric layer 70 is arranged on the upper side of the active layer 40, the piezoelectric layer 70 is further arranged on an upper side of the layer in which the drain electrode 51 and the drain electrode 52 are provided so as to benefit for the piezoelectric layer 70 to be applied with the pressure, thereby further improving pressure detection performance of the thin film transistor 100.

For example, a material of the piezoelectric layer 70 includes a flexible piezoelectric material. Due to the advantages of flexibility and difficulty in breakage of the flexible material, by adopting the flexible piezoelectric material, the embodiments of the present disclosure are particularly suitable for touch detection of a flexible display screen.

For example, the material of the piezoelectric layer 70 includes a high molecular piezoelectric material, e.g., polyvinylidene fluoride (PVDF) or a similar material. The PVDF is a flexible piezoelectric material and has the advantages of difficulty in breakage, waterproofness, rapid frequency response and the like; the PVDF is capable of being produced by a general thin film transistor production process, and for example, after the gate electrode 20, the second insulation layer 30, the active layer 40, the source electrode 51, the drain electrode 52 and the first insulation layer 60 of the thin film transistor are formed, the thin film transistor 100 as shown in FIG. 1 is obtained by forming a PVDF layer on the first insulation layer 60.

For example, in the embodiments of the present disclosure, a material of the active layer 40 is a semiconductor material, e.g., an amorphous silicon, polycrystalline silicon or metal oxide semiconductor and the like; the source electrode 51, the drain electrode 52 and the gate electrode 20 are made by adopting a metal material, e.g., aluminium, aluminium neodymium alloy, copper, titanium, molybdenum, molybdenum niobium alloy and the like; and the first insulation layer 60 and the second insulation layer 30 are an organic insulation layer, an inorganic insulation layer or a combination of the organic insulation layer and the inorganic insulation layer. In the embodiments of the present disclosure, a material of each part of the thin film transistor includes, but not limited to, the materials described above.

At least one embodiment of the present disclosure further provides a method for detecting a pressure by utilizing the thin film transistor 100 provided by any one embodiment above. The method includes: detecting an amount of a current between the source electrode 51 and the drain electrode 52 of the thin film transistor 100 as shown in FIG. 1; and according to the amount of the current, determining whether the piezoelectric layer 70 of the thin film transistor 100 is applied with the pressure and/or determining an amount of the pressure applied to the piezoelectric layer 70.

A principle for implementing pressure detection by utilizing the thin film transistor provided by the embodiments of the present disclosure will be described in connection with FIG. 2 and FIG. 3.

Figure 2:
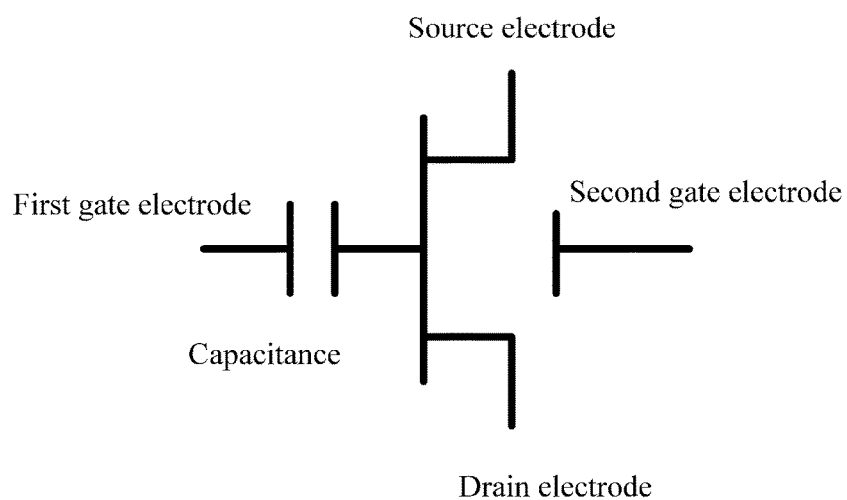
FIG. 2 is an equivalent circuit diagram of the thin film transistor provided by the embodiments of the present disclosure.
Figure 3:
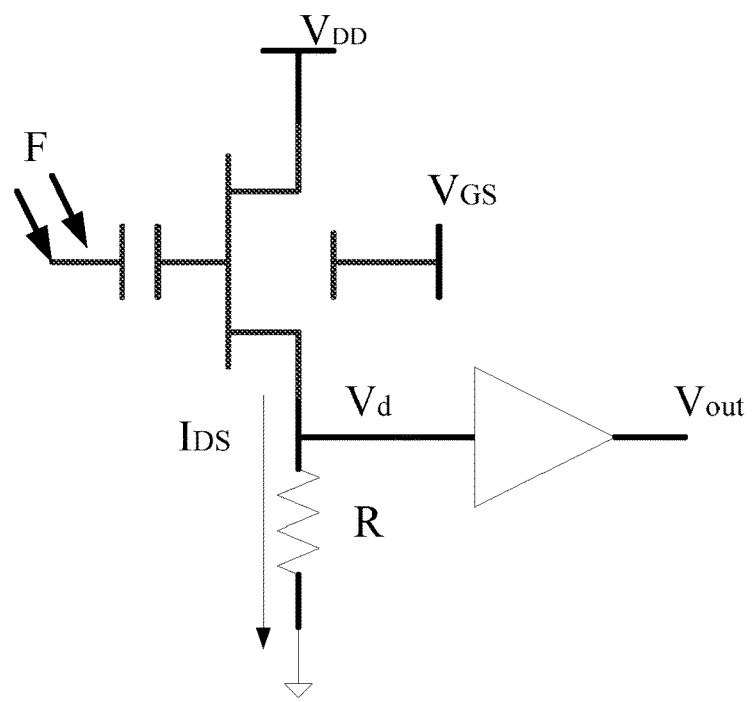
FIG. 3 is a schematic view illustrating an $I_{DS}$ detection circuit provided by the embodiments of the present disclosure.

For the thin film transistor 100 provided by any one embodiment of the present disclosure, as shown in FIG. 1, in the case that the first insulation layer 60 is arranged between the layer in which the source electrode 51 and the drain electrode 52 are provided and the piezoelectric layer 70 and the piezoelectric layer 70 and the gate electrode 20 are respectively arranged on opposite sides of the active layer 40, an equivalent circuit diagram of the thin film transistor 100 is as shown in FIG. 2; as shown in FIG. 2, the thin film transistor 100 is equivalent to the dual-gate thin film transistor, the dual-gate thin film transistor includes the second gate electrode, the source electrode, the drain electrode, the first gate electrode and the capacitance, and the capacitance is connected with the first gate electrode, the source electrode and the drain electrode; the piezoelectric layer 70 shown in FIG. 1 is equivalent to the first gate electrode shown in FIG. 2, the first insulation layer 60 and the piezoelectric layer 70 are integrally equivalent to the first gate electrode and the capacitance shown in FIG. 2, and the gate electrode 20, the source electrode 51 and the drain electrode 52 shown in FIG. 1 are respectively equivalent to the second gate electrode, the source electrode and the drain electrode shown in FIG. 2.

According to the equivalent circuit diagram shown in FIG. 2, it can be known that the value of the current $I_{DS}$ (i.e., a channel current) between the source electrode and the drain electrode is influenced by the first gate electrode (i.e., the piezoelectric layer 70) and the second gate electrode (i.e., the gate electrode 20) together, and it can be obtained that:

$$I_{DS} = \frac{1}{2}\mu_{FE} \cdot C_i \cdot \frac{W}{L}(V_{GS} - V_T)^2.$$

In the formula above, $\mu_{FE}$ represents a carrier mobility of the active layer, $C_i$ represents a parasitic capacitance of the second insulation layer, W and L respectively represent a width and a length of the channel of the thin film transistor, $V_{GS}$ represents a voltage between the second gate electrode and the source electrode, and $V_T$ represents a threshold voltage of the thin film transistor.

The thin film transistor is the dual-gate thin film transistor, and thus, the threshold voltage $V_T$ includes two portions respectively formed by the second gate electrode and the first gate electrode, i.e., $V_T = V_{T0} + V_{PG}$. In the formula, $V_{T0}$ represents the threshold voltage formed by the second gate electrode, and the threshold voltage $V_{T0}$ is determined by design parameters and production process of the second gate electrode (i.e., the gate electrode 20 in FIG. 1); $V_{PG}$ represents the threshold voltage formed by the first gate electrode (i.e., the piezoelectric layer 70 in FIG. 1), and $V_{PG}$ is related to the pressure applied to the piezoelectric layer 70, i.e., $$V_{PG} = \frac{d_{33} \cdot F}{C_{top}},$$

In the formula above, $C_{top}$ represents a parasitic capacitance of the first insulation layer, d33 represents a piezoelectric coefficient of the piezoelectric layer and is determined by the material of the piezoelectric layer, and F represents the pressure applied to the piezoelectric layer.

It can be seen from the formula above related to $I_{DS}$ and $V_{PG}$ that: in the case that the thin film transistor is applied with a constant $V_{GS}$ voltage and the voltage difference ($V_{DS}$) between the source electrode and the drain electrode is also kept constant, the current $I_{DS}$ between the source electrode and the drain electrode is changed if the piezoelectric layer is applied with different pressures (according to the formula above, it can be known that the current $I_{DS}$ is decreased along with increase of the pressure F). Therefore, by detecting the amount of the $I_{DS}$, whether the piezoelectric layer is applied with the pressure is determined and/or the amount of the applied pressure is determined.

For example, determination of whether the piezoelectric layer is applied with the pressure and/or determination of the amount of the applied pressure according to the value of the current $I_{DS}$ between the source electrode and the drain electrode of the thin film transistor is implemented in a mode of converting the $I_{DS}$ into a voltage. FIG. 3 is a schematic view illustrating an $I_{DS}$ detection circuit provided by the embodiments of the present disclosure. As shown in FIG. 3, the source electrode is applied with a voltage $V_{DD}$, the drain electrode is connected with a resistor R, the channel current $I_{DS}$ flows into the resistor R after flowing out of the drain electrode under the action of the pressure F, the voltage is that $V_d = I_{DS} * R$, $V_d$ is amplified by an amplifier to obtain $V_{out}$, and then $V_{out}$ is input into a processor to carry out calculation. By calculation, a relationship between $V_{out}$ and the pressure F applied to the piezoelectric layer is established, so that the amount of the pressure F is determined.

Figure 4A:
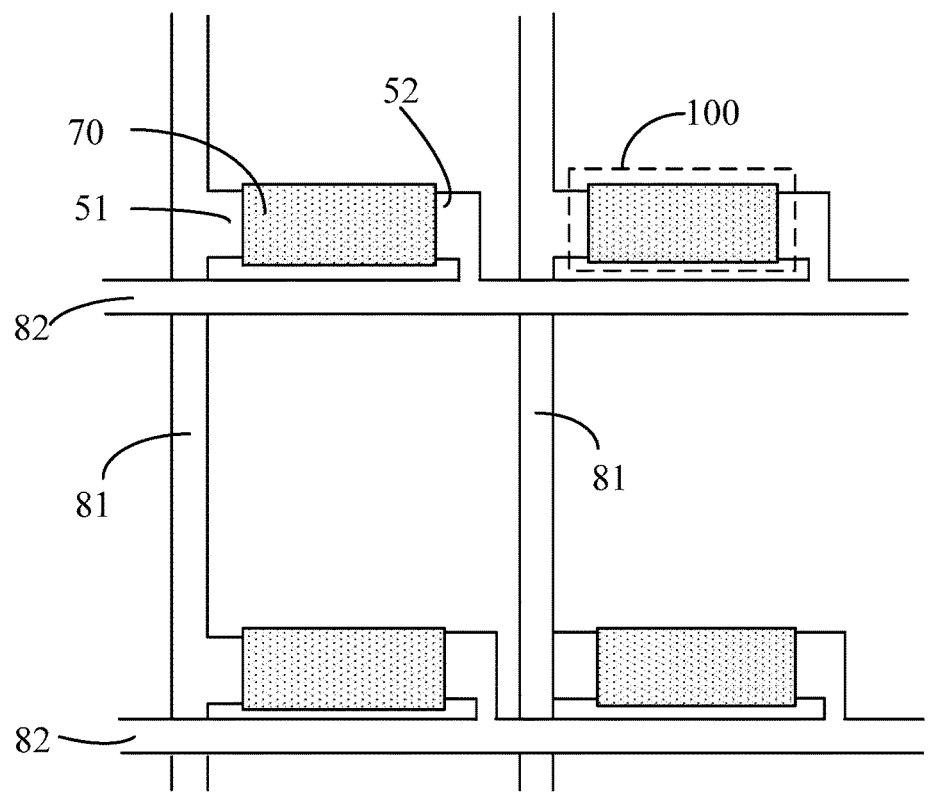
FIG. 4a is a top schematic view I illustrating a touch apparatus provided by the embodiments of the present disclosure.
Figure 4B:
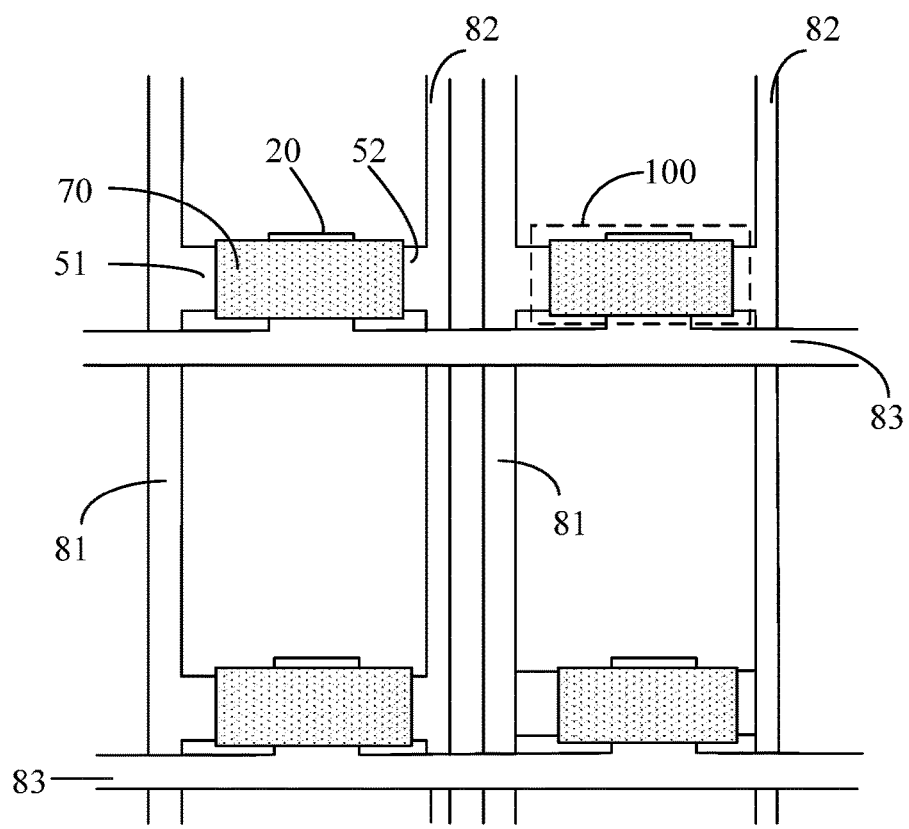
FIG. 4b is a top schematic view II illustrating the touch apparatus provided by the embodiments of the present disclosure.

At least one embodiment of the present disclosure further provides a touch apparatus. As shown in FIG. 4a and FIG. 4b, the touch apparatus includes a plurality of thin film transistors 100 provided by any one embodiment above, and the piezoelectric layers of the plurality of thin film transistors 100 are separated from each other. The thin film transistors 100 of the touch apparatus for example form a thin film transistor array, and in the case that a touch occurs, a position of the touched thin film transistor and an amount of the touch pressure are determined according to the currents between the source electrodes and the drain electrodes, which are output by the thin film transistors 100, and a touch position is obtained according to the position of the touched thin film transistor.

For example, in order to determine the position of the touched thin film transistor so as to implement touch positioning, the touch apparatus according to the embodiments of the present disclosure is provided as below.

Mode I: as shown in FIG. 4a, the touch apparatus provided by at least one embodiment of the present disclosure further includes a plurality of first signal lines 81 and a plurality of second signal lines 82; the first signal lines 81 are respectively connected with the source electrodes 51 of the plurality of thin film transistors 100 (as shown in FIG. 4a, the source electrode 51 of each thin film transistor 100 is connected with one first signal line 81); and the second signal lines 82 are respectively connected with the drain electrodes 52 of the plurality of thin film transistors 100 (as shown in FIG. 4a, the drain electrode 52 of each thin film transistor 100 is connected with one second signal line 82), and an extension direction of the second signal lines 82 and an extension direction of the first signal lines 81 intersect with each other. During the touch detection process, for example, the first signal lines 81 as shown in FIG. 4a are applied with a source voltage one by one so as to carry out scanning column-by-column; for example, the first signal line 81 of a $j^{th}$ column is scanned, and output signals of the second signal lines 82 corresponding to the thin film transistors 100 connected with the first signal line 81 of the $j^{th}$ column are detected; and if it is detected out that the thin film transistor of an $i^{th}$ row, which is connected with the first signal line 81 of the $j^{th}$ column, is touched, coordinates of the touch position is determined as (i, j).

Mode II: as shown in FIG. 4b, each of the thin film transistors 100 includes the second insulation layer 30 and the gate electrode 20 separated from the active layer 40 by the second insulation layer 30 as shown in FIG. 1, the touch apparatus provided by at least one embodiment of the present disclosure further includes: the plurality of first signal lines 81, which are respectively connected with the source electrodes 51 of the plurality of thin film transistors 100; the plurality of second signal lines 82, which are respectively connected with the drain electrodes 52 of the plurality of thin film transistors 100; and a plurality of third signal lines 83, which are respectively connected with the gate electrodes 20 of the plurality of thin film transistors 100; and an extension direction of the third signal lines 83 intersects with an extension direction of the first signal lines 81 or the second signal lines 82. For example, as shown in FIG. 4b, the extension direction of the first signal lines 81 and the extension direction of the second signal lines 82 are in parallel. During the touch detection process, for example, the third signal lines 83 are scanned row by row, so that a longitudinal coordinate of the touch position is determined according to the third signal lines 83, and a horizontal coordinate of the touch position is determined according to the second signal lines 82 so as to obtain the coordinates of the touch position.

Figure 5:
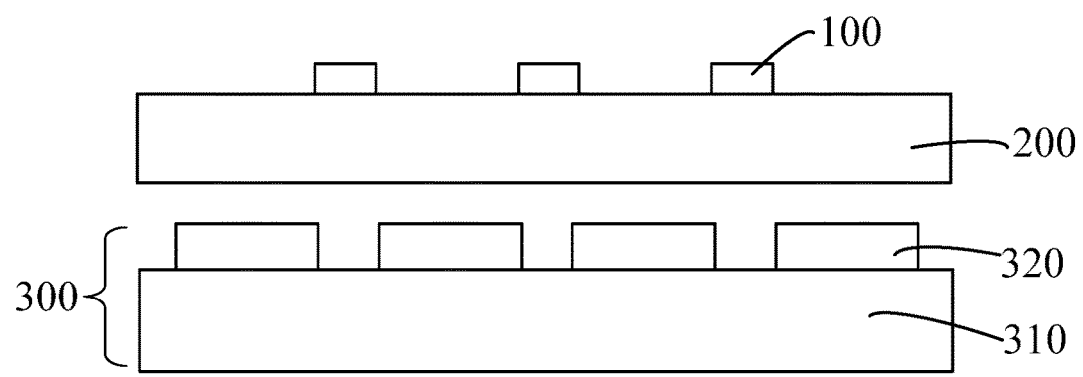
FIG. 5 is a sectional schematic view illustrating the touch apparatus provided by the embodiments of the present disclosure.

For example, the touch apparatus according to the embodiments of the present disclosure is an on cell type touch display apparatus. For example, as shown in FIG. 5, the touch apparatus provided by at least one embodiment of the present disclosure includes an array substrate 300 having a plurality of pixels 320 and an opposed substrate 200 (for example, the opposed substrate 200 is the base substrate 10 as shown in FIG. 1) opposite to the array substrate. The plurality of thin film transistors 100 of the touch apparatus as mentioned above for example are arranged on a side of the opposed substrate 200, which is far away from the array substrate 300. Therefore, in the case that the user touches the touch apparatus, the piezoelectric layers of the thin film transistors 100 are relatively close to the finger of the user, which is beneficial for improving the touch positioning effect of the touch apparatus. Certainly, the touch apparatus provided by the embodiments of the present disclosure may be applied to touch display apparatus in other modes, as long as touch positioning is implemented by utilizing the piezoelectric effect of the piezoelectric layer.

For example, the touch apparatus provided by the embodiments of the present disclosure is any product or part with display and touch functions, e.g., a liquid crystal touch display panel, an electronic paper, an organic light emitting diode (OLED) touch display panel, a mobile phone, a tablet personal computer, a television, a display, a notebook computer, a digital photo frame, a navigator and the like.

The above embodiments of the thin film transistor and the method for detecting the pressure by utilizing the thin film transistor and the touch apparatus may refer to each other. Moreover, in the case of no conflict, the embodiments of the present disclosure and the features in the embodiments may be combined with each other.

The foregoing embodiments merely are exemplary embodiments of the disclosure, and not intended to define the scope of the disclosure, and the scope of the disclosure is determined by the appended claims.

The present application claims priority of Chinese Patent Application No. 201610742811.8 filed on Aug. 26, 2016, the disclosure of which are incorporated herein by its reference in its entirety as part of the present application.

The invention claimed is:

1. A thin film transistor, comprising:
   an active layer;
   a source electrode and a drain electrode, separated from each other and both connected with the active layer;
   a first insulation layer, staked with the active layer, covering and directly contacting a surface of the source electrode facing away from the active layer and a surface of the drain electrode facing away from the active layer; and
   a piezoelectric layer, wherein in a direction perpendicular to the active layer, the first insulation layer is between the piezoelectric layer and the active layer, the source electrode as well as the drain electrode so that the piezoelectric layer is separated from the active layer, the source electrode as well as the drain electrode by the first insulation layer.

2. The thin film transistor according to claim 1, further comprising a gate electrode and a second insulation layer, wherein
   the second insulation layer separates the gate electrode from the active layer, and in a direction perpendicular to the active layer, the second insulation layer and the first insulation layer are respectively arranged on opposite sides of the active layer.

3. The thin film transistor according to claim 1, wherein in the direction perpendicular to the active layer, the first insulation layer is arranged between a layer in which the source electrode and the drain electrode are provided and the piezoelectric layer.

4. The thin film transistor according to claim 1, wherein in a direction from the source electrode to the drain electrode, a size of the piezoelectric layer is greater than or equal to a distance between the source electrode and the drain electrode.

5. The thin film transistor according to claim 1, wherein in a case that the piezoelectric layer is applied with a pressure, the piezoelectric layer is configured as a gate electrode of the thin film transistor.

6. The thin film transistor according to claim 1, further comprising a base substrate for bearing the active layer, the source electrode, the drain electrode, the first insulation layer and the piezoelectric layer, wherein
the piezoelectric layer is arranged on a side of the active layer, which is far away from the base substrate.

7. The thin film transistor according to claim 6, wherein the piezoelectric layer is positioned on a side of a layer in which the source electrode and the drain electrode are provided, which is far away from the active layer.

8. The thin film transistor according to claim 1, wherein a material of the piezoelectric layer includes a flexible piezoelectric material.

9. The thin film transistor according to claim 1, wherein a material of the piezoelectric layer includes a high molecular piezoelectric material.

10. A touch apparatus, comprising a plurality of thin film transistors according to claim 1, wherein the piezoelectric layers of the plurality of thin film transistors are separated from each other.

11. The touch apparatus according to claim 10, further comprising:
a plurality of first signal lines, respectively connected with the source electrodes of the plurality of thin film transistors; and
a plurality of second signal lines, respectively connected with the drain electrodes of the plurality of thin film transistors,
wherein an extension direction of the second signal lines and an extension direction of the first signal lines intersect with each other.

12. The touch apparatus according to claim 10, wherein each of the thin film transistor further includes a second insulation layer and a gate electrode, the gate electrode is separated from the active layer by the second insulation layer;
the touch apparatus further comprises:
a plurality of first signal lines, respectively connected with the source electrodes of the plurality of thin film transistors;
a plurality of second signal lines, respectively connected with the drain electrodes of the plurality of thin film transistors; and
a plurality of third signal lines, respectively connected with the gate electrodes of the plurality of thin film transistors, wherein an extension direction of the third signal lines intersects with an extension direction of the first signal lines or the second signal lines.

13. The thin film transistor according to claim 1, wherein the piezoelectric layer includes a portion positioned between the source electrode and the drain electrode in a direction in parallel to the active layer.

14. The thin film transistor according to claim 1, wherein the source electrode and the drain electrode are provided on a side of the active layer, which is opposite to a side of the active layer provided with the piezoelectric layer.

15. The thin film transistor according to claim 1, wherein the source electrode and the drain electrode are provided on a side of the active layer, which is same as a side of the active layer provided with the piezoelectric layer.

16. A method for detecting a pressure by utilizing a thin film transistor wherein
the thin film transistor comprises: an active layer; a source electrode and a drain electrode, separated from each other and both connected with the active layer; a first insulation layer, staked with the active layer, covering and directly contacting a surface of the source electrode facing away from the active layer and a surface of the drain electrode facing away from the active layer; and a piezoelectric layer,
in a direction perpendicular to the active layer, the first insulation layer is between the piezoelectric layer and the active layer, the source electrode as well as the drain electrode so that the piezoelectric layer is separated from the active layer, the source electrode as well as the drain electrode by the first insulation layer, and
the method comprises: detecting a value of a current between the source electrode and the drain electrode of the thin film transistor; and
according to the value of the current, determining whether the piezoelectric layer of the thin film transistor is applied with the pressure and/or determining an amount of the pressure applied to the piezoelectric layer.

* * * * *